(12) United States Patent
Shoji et al.

(10) Patent No.: US 6,400,184 B1
(45) Date of Patent: Jun. 4, 2002

(54) TRANSISTOR OUTPUT CIRCUIT

(75) Inventors: Norio Shoji; Hideyuki Nishioka, both of Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/765,579

(22) Filed: Jan. 22, 2001

(30) Foreign Application Priority Data

Jan. 24, 2000 (JP) ........................................ 2000-014805

(51) Int. Cl.[7] .............................................. H03K 19/20
(52) U.S. Cl. ........................... 326/126; 326/18; 326/33; 326/78; 326/89; 326/124; 326/128
(58) Field of Search ................................. 326/126, 128, 326/89, 124, 18, 22

(56) References Cited

U.S. PATENT DOCUMENTS 5,041,743 A * 8/1991 Matsumoto .................. 307/455
5,177,379 A * 1/1993 Matsumoto .................. 307/455

* cited by examiner

Primary Examiner—David Nelms
Assistant Examiner—Tu-Tu Ho
(74) Attorney, Agent, or Firm—Ronald P. Kananen; Rader, Fishman & Grauer PLLC

(57) ABSTRACT

A transistor output circuit featuring a low power consumption, high speed and stabilized operation is realized. The transistor output circuit of the invention is comprised of: transistors Q59 and Q57 having respective bases supplied with input signals in opposite phases, and respective emitters connected together; a transistor Q66 the base of which is connected to the collector of the transistor Q59; a diode Q65 connected to the emitter of the transistor Q66; a transistor Q63 the base of which is connected to the collector of transistor Q57 and to the other end of the diode Q65; resistances R73 and R74 connected to the emitter of the transistor Q63; a constant current supply Q64 connected to the resistances R73 and R74, provided with a bias circuit for setting its current at discretion; and transistor Q67 the base of which is, connected to a common connection point between the resistance and Q64, and the collector of which is connected to the emitter of transistor Q66: wherein this connection point between Q66 and Q67 is an output terminal.

11 Claims, 3 Drawing Sheets

TRANSISTOR OUTPUT CIRCUIT

BACKGROUND OF THE INVENTION

1. Field of the Invention

The present invention relates to a transistor output circuit, and in particular, the present invention relates to a transistor output circuit featuring a reduced power consumption and a high speed operation.

2. Description of the Related Art

Recently, a digital communication technology is widely used in a portable communication equipment and so on, and in addition, a trend for an increased communication capacity and higher speed of communication is in progress. In these portable and high speed digital communication technologies, it becomes more popular that the equipment is provided in a more compact size, light-weighted, and a battery operated form.

As one of IC circuits capable of realizing a high speed digital communication, there is an ECL (Emitter-Coupled-Logic) circuit comprised of bipolar transistors.

In the bipolar IC (Integrated Circuit) circuit comprising bipolar transistors, an analog signal after being subjected to a signal processing is converted in an A/D (Analog to Digital) converter to a digital signal and is derived from its output terminal, and this output signal is supplied through the above-mentioned ECL circuit to a CMOS (Complementary Metal Oxide Semiconductor) digital circuit for a digital signal processing.

As shown in FIG. 3, in the conventional ECL circuit for use in a high speed signal processing, pulse signals of opposite phase are supplied to respective bases of a bipolar transistors Q1 and Q2 which have their emitters connected at a common connection point, and this common connection point is further connected to a reference potential VEE (−5.2 V, for example) via a constant current supply I0. On the other hand, a collector of the transistor Q1 is connected to a reference potential of 0V, for example; and a collector of the transistor Q2 is connected via a load resistance R1 to the reference potential of 0V.

Further, it is arranged in the circuit of FIG. 3 such that a base of an output transistor Q3 is connected with a common connection point between the collector of the transistor Q2 and the load resistance R1, a collector of the transistor Q3 is connected to the reference potential of 0V, and an emitter of the transistor Q3 is set normally open, and then an output signal is taken out from an output terminal OUT.

Further, the emitter of the transistor Q3 is connected to the reference potential VEE (−5.2V) via a resistance R2 for setting its current from the output terminal OUT. In an output through-rate at a rising time of this ECL circuit is determined by a faculty of its transistor, and a falling time is determined by a value of the resistance R2 connected to the emitter of the transistor Q3, namely the output terminal OUT. In order to speed up its falling time, the resistance value of the resistance R2 has to be small, but this causes an increased dissipation of current.

Now, with reference to FIG. 4, an example of a so-called active pull down circuit or a CCPP (Complementary Coupled Push Pull) circuit will be described.

In differentially connected NPN type transistors Q11 and Q12, a pair of opposite phase signal s are supplied to bases of these transistors Q11 and Q12, and respective emitter thereof are connected together at a common connection point connected to a reference potential GND of 0V via a constant current supply I10. Further, a collector of the NPN transistor Q11 is connected to a reference power supply Vcc via a load resistance R11, and a collector of the NPN transistor Q12 is also connected to the reference power supply Vcc via a load resistance R12.

A common connection point between the collector of the NPN transistor Q11 and the load resistance R11 is connected via an inverting amplifier A1 to a base of an emitter follower NPN transistor Q14 which constitutes a voltage level shift circuit in the next stage. A collector of the transistor Q14 is connected to the reference power supply Vcc, and its emitter is connected to the reference potential GND of 0V via a constant current source I12.

Further, a common connection point between the collector of the NPN transistor Q12 and the load resistance R12 is connected to a base of an emitter follower PNP transistor Q13 which constitutes a voltage level shift circuit in the next stage. A collector of the transistor Q13 is connected to the reference potential GND of 0V, and an emitter thereof is connected to the reference power supply Vcc of 5V via a constant current supply I11.

An output stage of the circuit in FIG. 4 is comprised of a complementary PNP transistor and NPN transistor, wherein the emitter of the PNP transistor Q13 is connected to a base of an NPN transistor Q15, and a collector of this NPN transistor Q15 is connected to the reference potential GND of 0V.

The emitter of the transistor Q14 is connected to a base of the PNP transistor Q16, and an emitter of the PNP transistor Q16 is connected to an emitter of the NPN transistor Q15. A collector of the PNP transistor Q16 is connected to the reference potential GND of 0V.

Respective emitters of these PNP transistor Q16 and NPN transistor Q15 are connected together at a common connection point which is connected to an output terminal OUT, and an output signal is derived from the output terminal OUT.

Differential signals having an opposite phase to each other are supplied to respective bases of the NPN transistors Q11 and Q12, which constitute a differential amplifier, in which after respective signals supplied to these bases are inverted (180° phase shift), they are derived from respective collectors thereof. A gain of this differential amplifier is determined by one half of its emitter resistance and a ratio of the load resistances R11 to R12.

Signals that are amplified in the differential amplifier up to a predetermined amplitude (pulse waveforms in most cases) are supplied to the bases of the NPN transistor Q14 and the PNP transistor Q13, respectively, which constitute an emitter follower circuit in the next stage, and in which Vf voltage (forward voltage across the base and emitter of transistor; approximately 0.7V) is shifted. More particularly, its signal output to the collector of the NPN transistor Q11 is inverted in the inverting amplifier, then caused to drop by Vf (V) in the NPN transistor Q14, and is supplied to the base of the PNP type output transistor Q16.

On the other hand, the signal output to the collector of the NPN transistor Q12 is caused to rise by Vf (V) in the PNP transistor Q13, then is supplied to the base of the NPN type output transistor Q15.

Now, assuming that the base of the NPN transistor Q11 is at "H" level, and the base of the NPN transistor Q12 is at "L" level, then after inversion of these signals therein, there are derived a signal of "L" level at the collector of the transistor Q11, and a signal of "H" level at the collector of the transistor Q12.

Thus, the base of the PNP transistor Q13 becomes "H" (=Vcc) level, and also the emitter thereof becomes "H"

(=Vcc) level, as a result, because the base of the NPN type output transistor Q15 also becomes "H" (=Vcc−Vf) level, it turns ON so as to flow a current from the reference power supply Vcc of 5V toward an output side across the collector and the emitter of the transistor Q15. Therefore, the output terminal OUT becomes "H" (=Vcc−Vf) level.

On the other hand, the base of the NPN transistor Q14 in the next stage is supplied with a signal of "H" (Vcc) level as inverted in the inverting amplifier A1. This inverted (pulse) signal of "H" level when transferred to the next stage causes the emitter of the next stage NPN transistor Q14 to become "H" (Vcc−Vf) level. As a result, because the base of the output PNP transistor Q16 also becomes "H" (Vcc−Vf) level, the transistor Q16 turns OFF, and the emitter terminal thereof becomes open. Thereby, the output terminal OUT becomes an "H" level potential that is determined by the emitter of the NPN transistor Q15.

Alternatively, assuming that the base of the NPN transistor Q11 is "L" level, and the base of the NPN transistor Q12 is "H" level, these signals are inverted therein so that an "H" level signal is derived at the collector of the transistor Q11, and a "L" level signal is derived at the collector of the transistor Q12.

As a consequence, the base of the PNP transistor Q13 becomes "L" (=Vcc−VL1) level, and the emitter thereof becomes "L" (=Vcc−VL+Vf) level. As a result, the base of the output NPN transistor Q15 also becomes "L" (=Vcc−VL+Vf) level.

On the other hand, the "H" level signal at the collector of the NPN transistor Q11 is inverted by the inverting amplifier A1 in the next stage to become "L" level. This "L" level signal (in pulses) is transferred to the base of the NPN transistor Q14 thereby setting the same at "L" (=Vcc−VL2) level, further setting the emitter thereof at "L" (=Vcc−VL2 −Vf) level, thus, as a consequence, the base of the output PNP transistor Q16 also becomes "L" (=Vcc−VL2−Vf) level. Therefore, the output PNP transistor Q16 turns ON, thereby causing a current to flow from the load capacitance C and the resistance connected with the output terminal OUT to the reference potential GND of 0V via the emitter and collector of the PNP transistor Q16.

As a result, its emitter potential drops. If its output level (Vcc−VL1) and the output level (Vcc−VL2) of the inverting amplifier A1 are set such that VL1>>VL2, the transistor Q15 becomes off, allowing only the transistor Q16 to be on.

Further, there is a TTL circuit in addition to the ECL circuit for this purpose. An example of a high speed TTL (Transistor-Transistor-Logic) output circuits using the same is shown in FIG. 5. NPN transistors Q21 and Q22, in which opposite phase signals are supplied to their bases respectively by way of an input terminal IN, have their respective emitters connected; together at a common connection point, and this common connection point is connected to a reference potential GND of 0V via a constant current source I20.

On the other hand, a resistance R21 that is connected to a collector of the NPN transistor Q21 is connected to a reference potential Vcc of 5V. Further, a collector of the NPN transistor Q22 is connected to the reference potential Vcc of 5V via a resistance R22.

The collector of the NPN transistor Q21 is connected to a base of an NPN transistor Q23, a collector of the transistor Q23 is connected to the reference potential Vcc of 5V, and an emitter thereof is connected to the reference potential of 0V via a constant current source I21.

The collector of the NPN transistor Q22 is connected to a base of an NPN transistor Q24 in the next stage, a collector of the transistor Q24 is connected to the reference potential Vcc of 5V, and an emitter thereof is connected to the reference potential GND of 0V via resistances R23 and R24.

A collector of an NPN transistor Q25 is connected to the reference potential Vcc of 5V, and an emitter thereof is connected to an output terminal OUT and also to a collector of an NPN transistor Q26. The base of the NPN transistor Q24 is connected to the output terminal OUT via diodes D21 and D22. Further, a base of the NPN transistor Q26 is connected with a common connection point between the resistance R23 and the resistance R24. An emitter of this NPN transistor Q26 is connected to the reference potential GND of 0V.

Now, if a signal of "H" level is supplied to the base of the transistor Q21, and a signal of "L" level is supplied to the base of the transistor Q22, a signal of "L" level is derived at the collector of the NPN transistor Q21 due to inversion of its input signal. Further, at the collector of the NPN transistor Q22, a signal of "H" level is derived.

The signal of "L" level derived at the collector of the NPN transistor Q21 is supplied to the base of the NPN transistor Q23, then a signal of "L" level is derived from the emitter of the NPN transistor Q23. Then, this "L" level signal is supplied to the base of the NPN transistor Q25 in an output stage, as a consequence, setting this transistor Q25 in off state.

On the other hand, the collector of the NPN transistor Q22 becomes "H" level, and this "14" level signal is applied to the base of the NPN transistor Q24 and to the anode of the diode D21 in the following stage. This "H" level signal is divided by the resistances R23 and R24, and the common connection point between the resistances R23 and R24 becomes "H" level, as a result, a "H" level signal is supplied to the base of the output NPN transistor Q26. Thus, the NPN transistor Q26 turns on causing the collector output to drop to "L" level. This output NPN transistor Q26 tends to drop down to Vcesat.

Thereby, a current is caused to flow from the load resistance and the capacitance which are connected to the output terminal OUT via the collector and the emitter of the NPN transistor Q26 to the reference potential GND of 0V, thereby causing the output terminal OUT to become "L" level.

At this time, when the level of this output terminal OUT drops excessively, the diodes D21 and D22 become conductive so that, if a ratio of R23 and R24 is R23 : R24=1:2, the emitter and the base of the transistor Q24 become 1.5Vf and 2.5Vf respectively, thereby clamping the collector at 0.5 Vf. Therefore, "L" level of the output level becomes 0.5Vf.

In the next, when the "L" level signal is applied to the base of the differential transistor Q21 while the "H" level signal is applied to the base of the transistor Q22, respectively, the "H" level signal is derived at the collector of the NPN transistor Q21 due to inversion of its input signal. Further, at the collector of the NPN transistor Q22, the "L" level signal is derived.

The "H" level signal derived from the collector of the NPN transistor Q21 is supplied to the base of the NPN transistor Q23, and the "H" level signal is derived from the emitter thereof. Then, this "H" level signal is supplied to the base of the NPN transistor Q25 in the output stage, thereby consequently causing this transistor Q25 to turn on. Therefore, the output "H" level becomes Vcc−2Vf.

On the other hand, the "L" level signal derived from the collector of the NPN transistor Q22 is applied to the base of the NPN transistor Q24 and to the anode of the diode D21 in the next stage. Further, this "L" level signal is divided by the resistances R23 and R24, and a common connection point there-between becomes "L" level. As a result, the "L" level signal is supplied to the base of the output NPN transistor Q26. Thereby, the NPN transistor Q26 turns off, causing the output collector to become open.

Therefore, because the NPN transistor Q25 being in an operating state, a current flows from the reference potential Vcc of 5V to the output terminal OUT via the collector and the emitter thereof. Thereby, the potential of the output terminal OUT rises to become "H" level.

As described above, the ECL circuit shown in FIG. 3 is of the open emitter, and the emitter output current is set up from this emitter using an external resistance. In order to achieve a high speed operation and appropriate impedance matching, this set-up current is approximately several mA. In case the number of ECL circuits within IC increases, a total current increases, thereby increasing a current dissipation. Therefore, there is a problem that it is not suitable for use in the portable communication equipment, which is driven by batteries.

Further, as for the active pull-down circuit (CCPP) shown in FIG. 4, because it uses PNP transistors, and ft of these transistors is lower than that of NPN transistors, there is a problem that operation speed of the circuit becomes low.

Still further, in the case using the TTL circuit shown in FIG. 5, the operational speed of the circuit can be improved because of using NPN transistors. However, there is a problem that because its output stage transistor repeats saturation operation, its operation speed is not always high enough, and that its circuit tends to be affected by fluctuations in the power supply voltage and the temperature.

As described above, the conventional transistor output circuits have such problems that the transistor output circuit using ECL circuits consumes a large power, the transistor output circuit using the active pull-down circuits (CCPP) is not adequate in its operational speed, and the transistor output circuit using TTL circuits is also not high enough in operational speed and is unstable relative to fluctuations in the supply voltage and the temperatures.

SUMMARY OF THE INVENTION

The object of the present invention is to solve the above-mentioned problems associated with the conventional transistor output circuits by utilizing a relatively simple method and to provide for a novel transistor output circuit featuring a reduced power consumption, high processing speed, and stable operation, economically at a reduced cost.

In order to accomplish the above-mentioned object of the invention, a transistor output circuit according to one aspect of the invention is provided, comprising: a first and a second transistors, respective bases of which transistors are supplied with an opposite phase signal, respective emitters thereof are connected at a common connection point, and respective collectors thereof are connected to a first reference potential via each resistance; a third transistor, the base of which is connected to the collector of the first transistor, and the collector of which is connected to the first reference potential; a level shift, one end of which is connected to the emitter of the third transistor; a fourth transistor the base of which is connected to the collector of the second transistor and to another end of the first level shift, and the collector of which is connected to the first reference potential; a second level shift one end of which is connected to the emitter of the fourth transistor; a constant current supply, connected between another end of the second level shift and a second reference potential, and provided with a bias for setting a current at discretion; and a fifth transistor the base of which is connected to a common connection point between the constant current supply and the other end of the second level shift, and the collector of which is connected to the emitter of the third transistor, wherein: an output is obtained across the second potential and a common connection point between the collector of: the fifth transistor and the emitter of the third transistor.

According to another aspect of the invention, a transistor output circuit is provided, comprising: a first and a second transistors, respective bases of which transistors are supplied with an opposite phase signal, respective emitters thereof are connected at a common connection point, and respective collectors thereof are connected to a first reference potential via each resistance; a third transistor, the base of which is connected to the collector of the first transistor, and the collector of which is connected to the first reference potential; a level shift, one end of which is connected to the emitter of the third transistor; a fourth transistor the base of which is connected to the collector of the second transistor and to the other end of the first level shift, and the collector of which is connected to the first reference potential; a second level shift one end of which is connected to the emitter of the fourth transistor; a constant current supply, connected between the other end of the second level shift and a second reference potential, and provided with a bias for setting a current at discretion; a fifth transistor the base of which is connected to a common connection point between the constant current supply and the other end of the second level shift, and the collector of which is connected to the emitter of the third transistor; and a voltage supply for supplying a predetermined voltage to the common connection point between the constant current supply and the other end of the second level shift, wherein: an output is obtained across the second potential and a common connection point between the collector of the fifth transistor and the emitter of the third transistor.

According to still further aspect of the invention, a transistor output circuit is provided, comprising: a first and a second transistors, respective bases of which transistors are supplied with an opposite phase signal, respective emitters thereof are connected at a common connection point, and respective collectors thereof are connected to a first reference potential via each resistance; a third transistor, the base of which is connected to the collector of the first transistor, and the collector of which is connected to the first reference potential; a level shift, one end of which is connected to the emitter of the third transistor; a fourth transistor the base of which is connected to the collector of the second transistor and to the other end of the first level shift, and the collector of which is connected to the first reference potential; a second level shift one end of which is connected to the emitter of the fourth transistor; a first constant current supply, connected between the other end of the second level shift and a second reference potential, and provided with a bias for setting a current at discretion; a fifth transistor the base of which is connected to a common connection point between the first constant current supply and the other end of the second level shift, and the collector of which is connected to the emitter of the third transistor; a sixth and a seventh transistors corresponding to the above-mentioned fourth and the fifth transistors; a third and a fourth level shifts corresponding to the above-mentioned first and second level shifts; a dummy output stage circuit comprising a second constant current supply corresponding to the above-mentioned first constant current supply; and an inverting amplifier circuit for inverting and amplifying an output of the dummy output stage circuit, wherein: an output of the inverting amplifier circuit is fed back to, the first and the second constant current supplies as a bias voltage, and an output is obtained across the second reference potential and a common connection point between the collector of the fifth transistor and the emitter of the third transistor.

By provision of the above-mentioned arrangements according to the invention, a novel transistor output circuit can be realized economically at a reduced cost, which features a relatively simple circuitry configuration, reduced power consumption, high operational speed, and an improved stability of operation.

BRIEF DESCRIPTION OF THE DRAWINGS

Other features and advantages of the invention will be apparent from the following description taken in connection with the accompanying drawings, in which.

PREFERRED EMBODIMENTS OF THE INVENTION

A transistor output circuit according to a preferred embodiment of the invention will be described in detail in the following with reference to the accompanying drawings.

Figure 1:
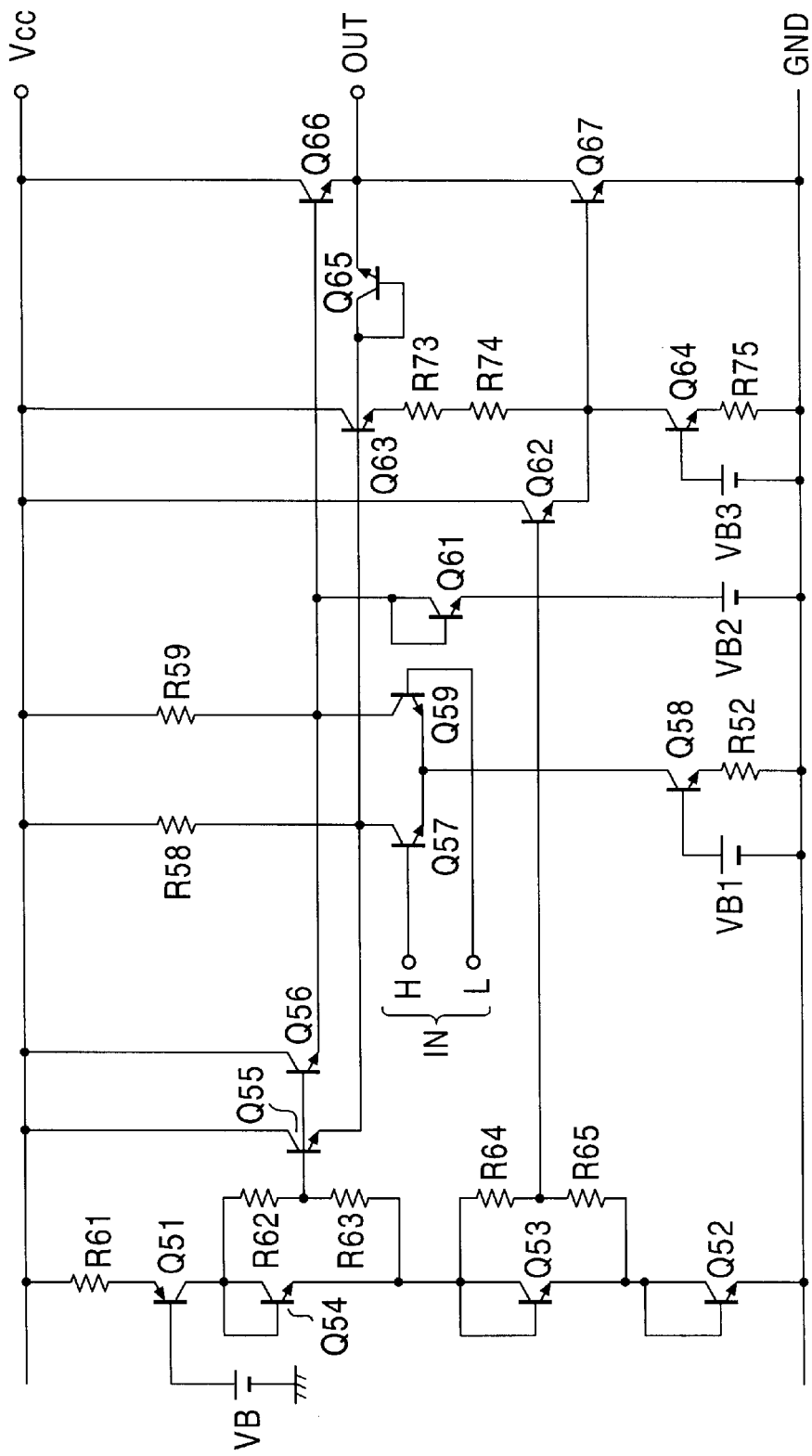
FIG. 1 is a circuit diagram of a transistor output circuit according to one embodiment of the invention.

FIG. 1 shows a diagram of a transistor output circuit of the invention.

In this transistor output circuit, respective bases of differential NPN transistors Q57 and Q59 are supplied with a signal having a different phase from each other by way of an input terminal IN, respective emitters of these transistors Q57 and Q59 are connected together at a common connection point, and this common connection point is connected to a collector of an NPN transistor Q58 which constitutes a constant current supply.

To a base of the NPN transistor Q58, a bias voltage VB1 is applied for setting its emitter current at a predetermined value. An emitter thereof is connected to a reference potential GND of 0 V either directly or via an emitter resistance R52.

On the other hand, a collector of the differential NPN transistor Q57 is connected to a reference potential Vcc of 3.3 V via a load resistance R58. Further, a collector of the NPN transistor Q59 is connected to the reference potential Vcc via a load resistance R59.

Further, it is also arranged for the collectors of the differential NPN transistors Q57 and Q59 to be supplied with a clamp voltage. Namely, a reference voltage generation circuit is provided which is configured as follows. The reference potential Vcc of 3.3 V is connected via a resistance R61 to an emitter of a PNP transistor Q51, and a bias voltage VB is applied to a base of the PNP transistor Q51 for setting a predetermined emitter current. Further, a collector of the PNP transistor Q51 is connected to a collector of a transistor Q54 constituting a diode in which the collector and a base thereof are connected together, and an emitter thereof which corresponds to a cathode is connected to a collector of an NPN transistor Q53 also constituting a diode in which the collector and a base thereof are connected together. The emitter of this diode constituting transistor Q53 is connected to a collector and a base of an NPN transistor Q52 also constituting a diode in which the collector and the base thereof are connected together, and an emitter thereof which corresponds to a cathode is connected to the reference potential GND of 0 V.

Resistances R62 and R63 in series connection are connected in parallel along the collector and the emitter of the diode constituting transistor Q54, and a common connection point between these series connection resistances R62 and R63 is connected to bases of NPN transistors Q55 and Q56. An emitter of the NPN transistor Q55 is connected to a collector of the NPN transistor Q57, and a collector of the transistor Q55 is connected to the reference potential Vcc.

Further, an emitter of the NPN transistor Q56 is connected to the collector of the NPN transistor Q59, and the collector of the transistor Q56 is connected to the reference potential Vcc.

The collector of the NPN transistor Q59 is connected to a base of an output NPN transistor Q66, and a collector of the NPN transistor Q66 is connected to the reference potential Vcc, and further, an emitter of the transistor Q66 is connected to an output terminal OUT and to a collector of an NPN transistor Q67.

On the other hand, the collector of the NPN transistor Q57 is connected to a base of the NPN transistor Q63 for use as a level shift, and also to a collector and a base of an NPN transistor Q65 structured as a diode. An emitter of the NPN transistor Q65 is connected to the output terminal OUT.

A collector of the NPN transistor Q63 is connected to the reference potential Vcc, and an emitter thereof is connected to the constant current supply via resistances R73 and R74.

A common connection point between this constant current supply and the resistance R74 is connected to a base of an NPN transistor Q67, an emitter thereof is connected to the reference potential GND of 0 V, and a collector thereof is connected to the output terminal OUT, respectively.

Further, the common connection point between the constant current supply and the resistance R74 is connected to an emitter of an NPN transistor Q62, and a base of the NPN transistor Q62 is connected to a common connection point between resistances R64 and R65 which are connected in series, and in parallel along the collector/base and the emitter of the NPN transistor Q53 having the diode construction. Further, the collector of the NPN transistor Q62 is connected to the reference potential Vcc.

The collector and the base which are connected together in the NPN transistor Q61 constituting a diode, are connected to the base of the output NPN transistor Q66, and an emitter of a transistor Q61 corresponding to a cathode is,supplied with the predetermined reference voltage VB2.

Preferably, the above-mentioned constant current supply which is connected between the resistance R74 and the reference potential GND of 0 V may be comprised, for example, of an NPN transistor Q64 and a resistance R75, in which a collector of the transistor Q64 is connected to the resistance R74, an emitter thereof is connected to the reference potential GND of 0 V via the resistance R75, and a base thereof is supplied with a predetermined voltage VB3.

Figure 2:
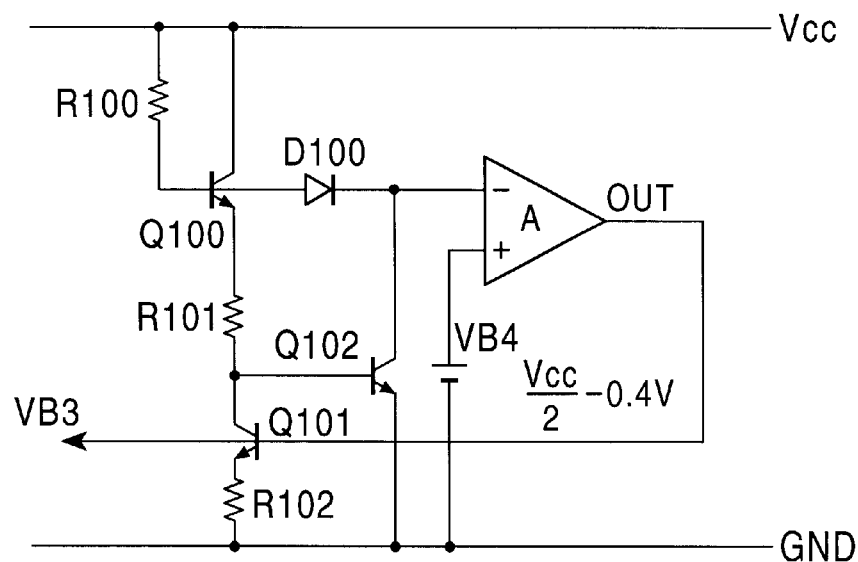
FIG. 2 is a circuit diagram of a voltage generation circuit used in the output circuit of FIG. 1.
Figure 3:
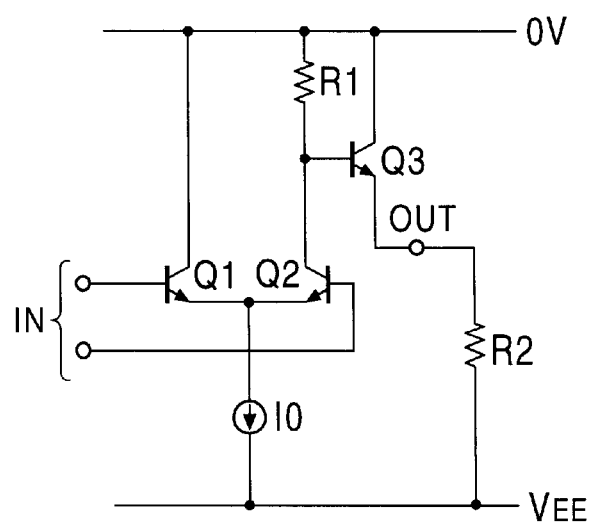
FIG. 3 is a circuit diagram of a transistor output circuit using a conventional ECL.
Figure 4:
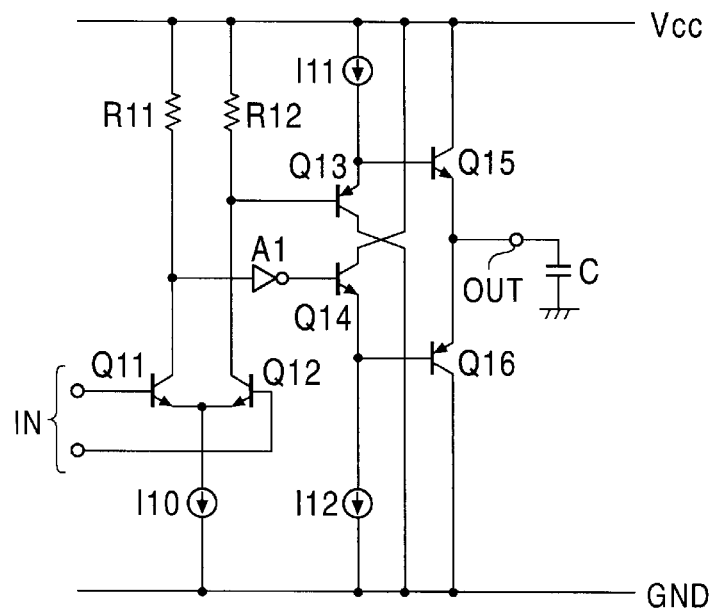
FIG. 4 is a circuit diagram of a transistor output circuit using a conventional CCPP.
Figure 5:
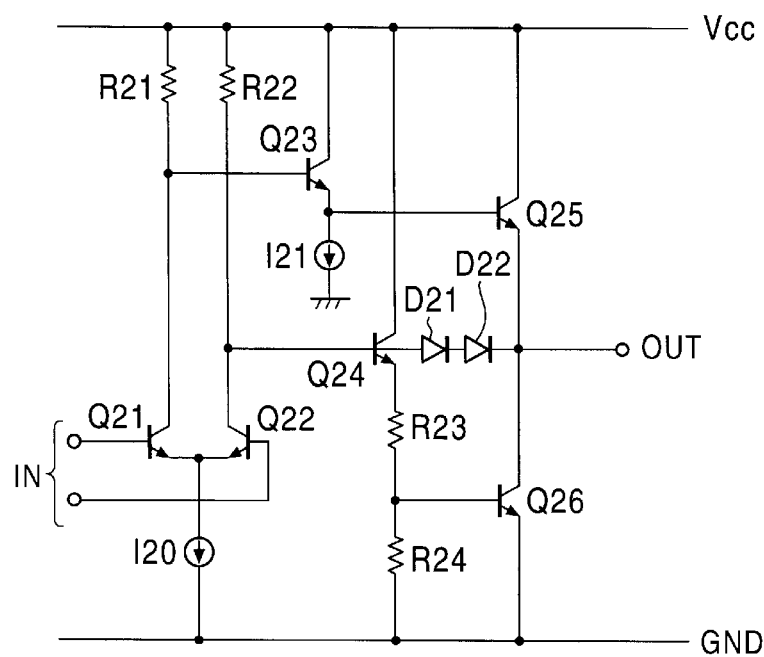
FIG. 5 is a circuit diagram of a transistor output circuit using a conventional TTL.

A voltage generation circuit for generating a voltage to be applied to the base of the NPN transistor Q64, which constitutes the constant current supply, will be described with reference to FIG. 2 in the following.

A base of an NPN transistor Q100 is connected to a reference potential Vcc via a resistance R100, and also to an anode of a diode D100. Further, a collector of the NPN transistor Q100 is connected to this reference potential Vcc. An emitter of the NPN transistor Q100 is connected to a collector of an NPN transistor Q101 via a resistance R101.

A common connections point between the resistance R101 and the collector of the NPN transistor Q101 is connected to a base of an NPN transistor Q102, an emitter of the transistor Q102 is connected to the reference potential GND of 0V, and a collector thereof is connected to a cathode of the diode D100 and to an inversion input terminal of an operational amplifier A. A positive (non-inversion) input terminal of the operational amplifier A is connected to a reference voltage of a predetermined value VB4 (=Vcc/2−0.4V).

An output terminal OUT of this operational amplifier A is connected to a base of the NPN transistor Q101 and to the base of the NPN transistor Q64 of the constant current supply shown in FIG. 1, for supplying the predetermined voltage VB3.

Now, operation of the transistor output circuit of the invention will be described with reference to FIG. 1.

Assume that an "H" level signal is applied to the base of the differential NPN transistor Q57, and an "L" level signal is applied to the base of the NPN transistor Q59. Then, the "L" level signal appears at the collector of the NPN transistor Q57, and the "H" level signal appears at the collector of the NPN transistor Q59, respectively.

As a result, the "H" level signal is applied to the base of the output NPN transistor Q66, and the "L" level signal is applied to the base of the NPN transistor Q63, respectively.

Thereby, the NPN transistor Q66 turns on, and the output terminal OUT becomes "H" level.

As the base of the NPN transistor Q63 is "L" level, a potential which is lower by VBE (V) than the potential of the base thereof, and further decreased by a current value × resistances R73+R74 is supplied to the base of the output NPN transistor Q67. However, because the potential to be supplied to this base is set at a value lower than VBE (V), the NPN transistor Q67 turns off.

During the time the output is "H" level, when the voltage of the output terminal OUT keeps increasing, the NPN transistor Q61 constituting a diode and the voltage supply VB2 in series connection therewith are caused to operate so as to clamp at a value of VB2+Vf (V). Thereby, the emitter of the output transistor Q66 is clamped at VB2.

Therefore, its output "H" level can be set by VB2. A time constant at a rising time of output from "L" level to "H" level is determined according to the load resistance R59 and the load capacitance CL such that τ=CL×R59/β, thereby enabling to provide for a through-rate approximately the same as that of an ECL circuit.

Further, the reason why respective emitters of the NPN transistors Q55 and Q56 are connected to respective collectors of the differential NPN transistors Q57 and Q59 is for setting a clamp level for the "L" level in order to prevent an excessive drop in collector potentials of the differential transistors Q57 and Q59.

Still further, in order to prevent for a base potential of the NPN transistor Q67 from dropping excessively, the emitter of the NPN transistor Q62 for clamping is connected to the base of the NPN transistor Q67, thereby clamping the base potential thereof, for example, at a value of VBE−0.3 (V).

Alternatively, assuming that the "L" level signal is applied to the base of the differential NPN transistor Q57 and the "H" level signal is applied to the base of the NPN transistor Q59 as their inputs, then the "H" level signal is output to the collector of the NPN transistor Q57 and the "L" level signal is output to the collector of the NPN transistor Q59, respectively.

Then, consequently, the "L" level signal is applied to the base of the output NPN transistor Q66, and the "H" level signal is applied to the base of the NPN transistor Q63, respectively.

Thereby, the NPN transistor Q66 turns off, and its emitter becomes open-state. As the base of the NPN transistor Q63 is "H" level, a potential which is lower than that of the base by VBE (V) and further by its current×resistances R73+R74 is supplied to the base of the output NPN transistor Q67. At this instant, because the potential to be supplied to the base thereof is set at a value higher than VBE (V), the NPN transistor Q67 turns on.

Subsequently, a current, flows from the output terminal OUT to the reference potential GND of 0 V through the collector and the emitter of the NPN transistor Q67, and as a result, the output terminal OUT becomes "L" level. Its voltage level of the output terminal OUT is obtained as follows from VBE of the output NPN transistor Q67 and by assuming a current of the constant current supply to be I.

$$i\ VBE(Q67)+I\times R74+VBE(Q63)-VBE(Q65)=Vf+I\times R74\ (V).$$

Therefore, by setting a current value of the constant current supply I at discretion, a potential value of "L" level at the output terminal OUT can be specified at discretion.

Namely, a current flowing through the collector and the emitter can be varied at discretion by setting a potential to be applied to the base of the NPN transistor Q64 at discretion. More specifically, assuming a base potential of the NPN transistor Q64 to be VB3, preferably, its current is set such that I=VB3−VBE/R75 (Kohm) (mA).

With this current I defined above, the output potential of "L" level can be set as described above such that VL=VBE+I×R75 (V). A time constant of a falling ti Me from output "H" level to "L" level is τ=CL×R74/β. Thereby by setting a value of the resistance R74 appropriately, substantially the same through-rate can be obtained both for the rising and the falling time constants.

Respective clamp potentials described above are obtained by provisions of a series connection of the resistance R61, the PNP transistor Q51, the diode-connected transistors Q54, Q53 and Q52 between the reference voltage supply Vcc and the reference potential GND of 0 V, and also of a series connection of the resistances R62 and R63 which are arranged in parallel with the diode-connected transistor Q54 between the collector and the emitter thereof, and then by supplying a clamp voltage from a common connection point between these resistances R62 and R63 to respective collectors of the differential transistors Q57 and Q59 via the NPN transistors Q55 and Q56, respectively.

Further, the resistances R64 and R65 are connected in series and in parallel with the diode Q53, then a clamp voltage is supplied from a common connection point between the resistances R64 and R65 to the base of the NPN transistor Q62.

Now, with reference to FIG. 2, the predetermined voltage VB3 to be supplied to the constant current supply NPN transistor Q64 which determines the "L" level will be described in the following.

Assume that a voltage of VB4=Vcc/2−0.4 (V) is applied to the non-inverting input terminal of the operational amplifier A, and that a voltage of the inverting input terminal increases more than this VB4. At this instant, a voltage of its output terminal OUT drops, and this dropped voltage is fed back, to the base of the NPN transistor Q101. Due to a drop in its base potential, collector and emitter currents thereof decrease, as a result, the emitter potential of the NPN transistor Q100 rises, then the base potential thereof rises also accordingly.

However, because the; base potential of the NPN transistor Q102 rises, and its collector current increases accordingly, a current flowing through the diode D100 also increases. As a result, a voltage drop in the diode D100 increases, thereby causing the voltage to be supplied to the inverting input terminal to decrease so as to become equivalent to voltage VB4 at the non-inverting input terminal of the operational amplifier A. 25 On the other hand, when the voltage to be applied to the non-inverting input terminal drops, a reverse action opposite to the operation described above takes place (detailed description is omitted).

Because that the base of the NPN transistor Q101 is applied with a voltage which is fed back from the operational amplifier A, and that this voltage is applied to the base of the constant current supply transistor Q64 which is described above in reference to FIG. 1, a stable voltage is ensured to be supplied according to the invention. FIG. 2 is a schematic diagram of a circuit configuration corresponding in part to that of FIG. 1 in which, in particular, when the output "L" level is output. Therefore, the output "L" level in FIG. 1 is equivalent to the level at the inverting-input terminal of the operational amplifier A in FIG. 2.

Thereby, its output voltage of "H" level output (VOH) becomes VOH=Vcc/2+0.4 on the basis of VB2=Vcc/2+0.4, and its output voltage of "L" level output (VOL) becomes VOL=Vcc/2−0.4 on the basis of VB4=Vcc/2−0.4 . These output voltages are ensured to be stabilized against a voltage fluctuation in the power supply and the temperature changes.

As described above, in the transistor output circuit of the invention, the final stage NPN transistors disposed in the upper and the lower directions in FIG. 1 are ensured to execute push-pull operation without saturation, thereby enabling to operate at an equivalent speed as in the ECL circuit, and further eliminating the need to minimize emitter resistance in order to ensure a falling time as required in the ECL circuit. Thereby, in addition to the above advantages, a power consumption also can be minimized.

Still further, also, there is such an advantage that "H" level and "L" level can be set at any values at discretion, thereby enabling for a signal processing amplitude to be variable.

Still more, because its voltage supply sources are constructed using in part the same circuit in FIG. 1 in order to specify the output level, in particular, "L" level, a stable operation is ensured to be maintained.

As described above, a transistor output circuit of the invention as claimed in claim 1 is comprised of: the first and the second transistors in which input signals having opposite phases to each other are supplied to respective bases, respective emitters thereof are connected together at the common connection point, and respective collectors thereof are connected to the first reference potential via respective load resistances; the third transistor the base of which is connected to the collector of the first transistor, and the collector of which is connected to the first reference potential; the first level shift one end of which is connected to the emitter of the third transistor; the fourth transistor the base of which is connected to the collector of the second transistor and to the other end of the first level shift, and the collector of which is connected to the first reference potential; the second level shift one end of which is connected to the emitter of the fourth transistor; the constant current supply connected between the other end of the second level shift and the second reference potential, and provided with the bias for setting a value of its current at discretion; and the fifth transistor the base of which is connected to the common connection point between the constant current supply and the other end of the second level shift, and the collector of is which is connected to the emitter of the third transistor, wherein: the output is obtained across the second reference potential and the common connection point between the collector of the fifth transistor and the emitter of the third transistor.

Thereby, in this transistor output circuit of the invention, the NPN transistors in the upper and the lower directions in the final stage are ensured to execute push-pull. operation without saturation, thereby enabling to operate at the equivalent speed as ECL circuit. Still further, it is not necessary to minimize the emitter resistance in order to secure an adequate falling speed although required in the ECL circuit, thereby enabling to minimize the power consumption.

Still further, according to the invention as claimed in claim 4, a transistor output circuit thereof is comprised of: the first and the second transistors in which input signals having opposite phases to each other are supplied to respective bases, respective emitters thereof are connected together at the common connection point, and respective collectors thereof are connected to the first reference potential via respective load resistances; the third transistor the base of which is connected to the collector of the first transistor, and the collector of which is connected to the first reference potential; the first level shift one end of which is connected to the emitter of the third transistor; the fourth transistor the base of which is,connected to the collector of the second transistor and to the other end of the first level shift, and the collector of which is connected to the first reference potential; the second level shift one end of which is connected to the emitter of the fourth transistor; the constant current supply connected between the other end of the second level shift and the second reference potential, and provided with the bias for setting its current at discretion; the fifth transistor the base of which is connected to the common connection point between the constant current supply and the other end of the second level shift, and the collector of which is connected to the emitter of the third transistor; and the voltage supply for supplying a predetermined voltage to the common connection point between the constant current supply and the other end of the second level shift, wherein: its output is obtained across the second reference potential and the common connection point between the collector of the fifth transistor and the emitter of the third transistor.

Thereby, in this transistor output circuit of the invention, the NPN transistors in the upper and the lower directions in the final stage are ensured to execute push-pull operation without saturation, thereby enabling to operate at the equivalent speed as ECL circuit. Still further, it is not necessary to minimize the emitter resistance in order to secure an adequate falling speed as required in the ECL circuit, thereby enabling to minimize the power consumption. Still more, advantageously, "H" level and "L" level for the logic level can be set at any values, thereby enabling for the signal processing amplitude to be set variable.

Still more, according to the invention as claimed in claim 7, a transistor output circuit thereof is comprised of: the first and the second transistors in which input signals having opposite phases to each other are supplied to respective bases, respective emitters are connected together at the common connection point, and respective collectors are connected to the first reference: potential via respective load resistances; the third transistor the base of which is connected to the collector of the first transistor, and the collector of which is connected to the first reference potential; the first level shift one end of which is connected to the emitter of the third transistor; the fourth transistor the base of which is connected to the collector of the second transistor and to the other end of the first level shift, and the collector of which is connected to the first reference potential; the second level shift one end of which is connected to the emitter of the fourth transistor; the first constant current supply connected between the other end of the second level shift and the second reference potential, and provided with the bias for setting its current at discretion; the fifth transistor the base of which is connected to the common connection point between the first constant current supply and the other end of the second level shift, and the collector of which is connected to the emitter of the third transistor; the sixth and the seventh transistors corresponding to the fourth and the fifth transistors; the third and the fourth level shifts corresponding to the first and the second level shifts; the dummy stage output circuit comprising the second constant current supply corresponding to the first constant current supply; and the inverting amplifier circuit for inverting and amplifying the output from the dummy stage output circuit, wherein: the output of the inverting amplifier circuit is fed back to the first and the second constant current supplies as the bias voltage, and the output is obtained across the second reference potential and the common connection point between the collector of the fifth transistor and the emitter of the third transistor.

Thereby, in this transistor output circuit of the invention, NPN transistors in the upper and the lower directions in the final stage are ensured to perform push-pull operation without saturation, thereby enabling to operate at the equivalent speed as an ECL circuit. Still further, it is not necessary to minimize the emitter resistance in order to secure an appropriate falling time as required in the ECL circuit, thereby enabling to minimize the power consumption. Still more, "H" level and "L" level with respect to the logic level can be set at any values at discretion, thereby enabling for the signal processing amplitude to be set variable. Furthermore, the transistor output circuit of the invention can be operated stably without being affected by voltage fluctuations in the power supply and the temperature changes.

What is claimed is:

1. A transistor output circuit comprising:
    a first and a second transistors, wherein input signals each having an opposite phase to each other are supplied to respective bases of the first and the second transistors, respective emitters of the first and the second transistors are connected together at a common connection point, and respective collectors of the first and the second transistors are connected to a first reference potential via at least a load resistance;
    a third transistor, wherein a base of the third transistor is connected to the collector of said first transistor, and a collector of the third transistor is connected to said first reference potential;
    a first level shift, wherein one end of the first level shift is connected to an emitter of said third transistor;
    a fourth transistor, wherein a base of the fourth transistor is connected to the collector of said second transistor and to the other end of said first level shift, and a collector of the fourth transistor is connected to said first reference potential;
    a second level shift, wherein one end of the second level shift is connected to an emitter of said fourth transistor;
    a constant current supply connected between the other end of said second level shift and a second reference potential to provide a bias voltage for setting a value of its current at discretion; and
    a fifth transistor, wherein a base of the fifth transistor is connected to a common connection point between said constant current supply and the other end of said second level shift, a collector of the fifth transistor is connected to the emitter of said third transistor; wherein:
        an output is obtained across said second reference potential and a common connection point between the collector of said fifth transistor and the emitter of said third transistor.

2. The transistor output circuit according to claim 1, wherein said first level shift comprises a diode.

3. The transistor output circuit according to claim 1, wherein
    said second level shift comprises a resistance.

4. A transistor output circuit comprising:
    a first and a second transistors, wherein input signals each having an opposite phase to each other are supplied to respective bases of the first and the second transistors, respective emitters of the first and the second transistors are connected together at a common connection point, and respective collectors of the first and the second transistors are connected to a first reference potential via at least a load resistance;
    a third transistor, wherein a base of the third transistor is connected to the collector of said first transistor, a collector of the third transistor is connected to said first reference potential;
    a first level shift, wherein one end of the first level shift is connected to an emitter of said third transistor;
    a fourth transistor, wherein a base of the fourth transistor is connected to the collector of,said second transistor and to the other end of said first level shift, and a collector of the fourth transistor is connected to said first reference potential;
    a second level shift, wherein one end of the second level shift is connected to an emitter of said fourth transistor;
    a constant current supply connected between the other end of said second level shift and a second reference potential to provide a bias voltage for setting a value of its current at discretion;
    a fifth transistor, wherein a base of the fifth transistor is connected to a common connection point between said constant current supply and the other end of said second level shift, and a collector of the fifth transistor is connected to the emitter of said third transistor; and
    a voltage source for supplying a predetermined voltage to the common connection point between said constant current supply and the other end of said second level shift, wherein:
        an output is obtained across said second reference potential and a common connection point between the collector of said fifth transistor and the emitter of said third transistor.

5. The transistor output circuit according to claim 4, wherein
    said first level shift comprises a diode.

6. The transistor output circuit according to claim 4, wherein said second level shift comprises a resistance.

7. A transistor output circuit comprising:

a first and a second transistors, wherein an input signal having an opposite phase to each other is supplied to respective bases of the first and the second transistors, respective emitters of the first and the second transistors are connected together at a common connection point, and respective collectors of the first and the second transistors are connected to a first reference potential via at least a load resistance;

a third transistor, wherein a base of the third transistor is connected to the collector of said first transistor, a collector of the third transistor is connected to said first reference potential;

a first level shift circuit, wherein one end of the first level shift circuit is connected to an emitter of said third transistor;

a fourth transistor, wherein a base of the fourth transistor is connected to the collector of said second transistor and to the other end of said first level shift circuit, and a collector of the fourth transistor is connected to said first reference potential;

a second level shift circuit, one end of which is connected to the emitter of said fourth transistor;

a first current source connected between the other end of said second level shift circuit and a second reference potential to provide a bias voltage for setting a value of its current at discretion;

a fifth transistor, wherein a base of the fifth transistor is connected to a common connection point between said first current source and the other end of said second level shift circuit, and a collector of the fifth transistor is connected to the emitter of said third transistor; and a sixth transistor provides as a diode, wherein one end of the sixth transistor is connected to the collector of said first transistor, the other end of the sixth transistor is connected to said second reference potential via a voltage source; wherein a midpoint of connection between said third transistor and said fifth transistor is connected to an output terminal.

8. The transistor output circuit according to claim 7, wherein said first current supply comprises:

a seventh transistor, wherein a collector of the seventh transistor is connected to said first reference potential, and a base of the seventh transistor is connected also to said first reference potential via a resistance;

an operational amplifier having an inverting input terminal connected to the base of said seventh transistor, and a non-inverting input terminal connected to a predetermined voltage; and an eighth transistor, wherein a base of the eighth transistor is connected to an output terminal of said operational amplifier.

9. The transistor output circuit according to claim 8, further comprising:

a ninth transistor, wherein a base of the ninth transistor is connected to the output of said operational amplifier; and a tenth transistor, wherein a base of the tenth transistor is connected to a collector of said ninth transistor, and a collector of the tenth transistor is connected to said inverting input terminal of the operational amplifier.

10. The transistor output circuit according to claim 7, further comprising:

a first clamp device for clamping potentials of collectors of said first and said second transistors.

11. The transistor output circuit according to claim 7, wherein values of voltages of said bias voltage and said voltage source are symmetrical with respect to a given potential.

* * * * *